(12) United States Patent
Lee

(10) Patent No.: US 6,391,764 B1
(45) Date of Patent: May 21, 2002

(54) METHOD FOR FABRICATING SEMICONDUCTOR DEVICE

(75) Inventor: Sung Kwon Lee, Seoul (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/705,704

(22) Filed: Nov. 6, 2000

(30) Foreign Application Priority Data

Nov. 4, 1999 (KR) .......................................... 1999-48661

(51) Int. Cl.[7] .......................................... H01L 21/4763
(52) U.S. Cl. ........................ 438/622; 438/623; 438/624; 438/631; 438/637
(58) Field of Search .................................... 438/618, 621, 438/622, 623, 624, 626, 631, 637

Primary Examiner—Long Pham
(74) Attorney, Agent, or Firm—Pillsbury Winthrop LLP

(57) ABSTRACT

A method for fabricating a semiconductor device includes the steps of: forming a transistor on a semiconductor substrate; forming a first interlayer insulating film over the entire structure including the transistor; planarizing the first interlayer insulating film; forming a stabilized insulating film consisting of an insulating material having low thermal expansion and shrinkage on the first interlayer insulating film; forming an interconnection line on the stabilized insulating film; forming a second interlayer insulating film on the stabilized insulating film to cover the interconnection line; and forming a metal electrode on the second interlayer insulating film in order to contact the semiconductor substrate. The interconnection line on the interlayer insulating film does not move as a result of the thermal treatment process, and thus does not cause shorts with the metal electrode. As a result, the leakage current is prevented and the electrical properties of the semiconductor is improved.

20 Claims, 9 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and in particular to a method for fabricating a semiconductor device which can improve electrical properties of the semiconductor device, by preventing short from occurring between an interconnection line and a metal electrode.

2. Description of the Background Art

Recently, integration of a semiconductor device has been remarkably improved. As a result, there is a strong demand for a method for easily fabricating a transistor and planarizing an interlayer insulating film to enhance the integration of the semiconductor device.

So as to maximize a planarization property, a method for improving the planarization property according to an etching process has been mostly performed on borophosphosilicate glass (BPSG) film used for planarization of the interlayer insulating film, after performing a flow (or reflow) process at a high temperature.

When performed at temperatures over 820° C., the high temperature flow process can improve the planarization property of the BPSG film. However, impurities are diffused into a gate electrode during the high temperature thermal treatment process, thereby degrades the performance properties of the semiconductor device.

In order to overcome this disadvantage, the flow process of the BPSG film must be performed at a temperature below 820° C. In flow processes at temperatures below 820° C., however, planarization of the BPSG film is generally not satisfactory.

Accordingly, an interconnection line formed on the interlayer insulating film having a poor planarization property is moved thereon during a succeeding thermal treatment process, and thus short may occur between the interconnection line and an adjacent metal electrode.

Even if the flow process is performed over 820° C. on the BPSG film to improve the planarization property, subsequent movement of the interconnection line is not completely avoided, which degrades the performance of the semiconductor device.

In this regard, a conventional method for fabricating a semiconductor device will now be described with reference to FIGS. 1 to 4.

FIG. 1 is a cross-sectional view illustrating the conventional method for fabricating the semiconductor device.

FIG. 2 is a cross-sectional view illustrating the conventional method for fabricating the semiconductor device in a state where short is generated between a polysilicon electrode and a metal electrode due to a movement resulting from the thermal treatment process.

FIGS. 3 through 6 are graphs respectively showing the relation between the movement range of the polysilicon electrode due to the thermal processes as a function of variations in the design rules, the steps of the thermal treatment process, the thermal treatment process temperature and the ratio of boron and phosphorus in the BPSG film are varied.

As illustrated in FIG. 1, an active region and a device isolating region are defined by forming a device isolating film 2 on a semiconductor substrate 1.

A gate oxide film 3, a gate conductive film 4 and a hard mask film 5 are sequentially stacked on the active region where the device isolating film 2 is not formed.

The gate oxide film 3, gate conductive film 4 and hard mask film 5 are selectively patterned according to a photolithography and developing processes. Thereafter, spacers 7 are formed at the side portions of the patterned films, thereby forming a gate electrode.

On the other hand, the gate conductive film 4 and the hard mask film 5 are stacked on the active region where the device isolating film 2 is formed, and patterned in a predetermined shape. The spacers 7 are formed at the side portions of the patterned films to form the gate electrode.

A lightly-doped region 6a and a highly-doped region 6b are formed on the semiconductor substrate 1 of the active region, and thus a source region and a drain region are respectively defined.

A first interlayer insulating film having a stacked structure comprising a tetraethylorthosilicate (TEOS) oxide film 8 and a BPSG film 9 is formed on the gate electrode consisting of the gate oxide film 3, gate conductive film 4, hard mask film 5 and spacers 7. A polysilicon electrode 10 is formed above to serve as an interconnection line (the gate electrode).

Then, a second interlayer insulating film 11 is formed on the first interlayer insulating film to cover the polysilicon electrode 10.

A contact hole (not shown) is formed on the second interlayer insulating film 11. A metal electrode 12 is formed on the second interlayer insulating film 11 and extending through the contact hole to contact the source/drain region 6b of the active region.

Here, the interconnection line may comprise $WSi_x$, $PtSi_x$, $CoSi_x$, $TiSi_x$, and/or $WSi_x$/polysilicon.

In addition, the high temperature flow process is performed on the first interlayer insulating film to 8, 9 improve the planarization property.

As described above, when the stacked structure comprising the TEOS oxide film 8 and the BPSG film 9 is employed as the first interlayer insulating film, the polysilicon electrode 10 moves along the BPSG film 9 during the succeeding thermal treatment process, as shown in FIG. 2 (solid line), and may generate a short with the metal electrode 12.

Especially in those cases in which the thermal treatment process is performed below 820° C., the resulting BPSG film 9 is not well planarized and, as a result, the polysilicon electrode 10 is often moved in adjacent regions having low pattern density.

FIG. 3 shows a movement range of the polysilicon electrode P2 when the design rules of the semiconductor devices range from 0.18 to 0.55 μm and the thermal treatment process is performed at a temperature over 800° C. at least three times.

Referring to FIG. 3, the polysilicon electrode P2 is moved on the BPSG film by at least 0.3 μm as a result of the thermal treatment process.

In the case of a high integration semiconductor device having a design rule of 0.25 μm, the interconnection line deposited on the BPSG film, such as the polysilicon electrode, is moved by more than 0.3 μm due to the thermal treatment process, and thus increasing the likelihood of a short forming between the interconnection line and the metal electrode.

As illustrated in FIG. 4, when the flow process is carried out on the BPSG film at a temperature over 820° C., the polysilicon electrode P2 is moved by 0.2 μm as a result of a second thermal treatment process (second BPSG), and 0.35 μm as a result of a third thermal treatment process (third BPSG).

As described above, the movement range of the polysilicon electrode P2 is increased by repetition of the thermal treatment process. Therefore, when a multi-step thermal treatment process is utilized, a short nearly always occurs between the polysilicon electrode P2 and the metal electrode.

As shown in FIG. 5, when the first thermal treatment process is performed at temperatures of 800° C., 820° C. and 850° C., the polysilicon electrode P2 is moved by about 0.35 μm, 0.31 μm and 0.3 μm, respectively.

Referring to FIG. 6, the movement range of the polysilicon electrode P2 on the BPSG film varies according to the content ratio of boron and phosphorus in the BPSG film being subjected to the high temperature flow process.

That is, when the flow process is performed at 850° C., the movement range of the polysilicon layer is larger when a content ratio of boron to phosphorus is 4.5:4.2 (71) than when it is 4.0:4.2 (72).

However, in either case, the polysilicon electrode P2 is moved by more than 0.3 μm.

As a result, when the thermal treatment process is performed below 820° C. to prevent diffusion, and when the flow process is executed over 820° C. to planarize the BPSG film, the polysilicon electrode P2 is moved by at least 0.3 μm as a result of the multi-step thermal treatment process.

Degradation of the semiconductor device resulting from the movement of the polysilicon electrode is not monitored and/or confirmed by using a test pattern until the fabrication process is completely finished. Thus, it is a very serious and costly problem in the fabrication process of the semiconductor device.

FIGS. 7 and 8 are cross-sectional views illustrating a semiconductor device fabricated in accordance with the conventional method for overcoming such a disadvantage. That is, FIGS. 7 and 8 are cross-sectional views of a technique for preventing shorts from occurring between the polysilicon electrode and the metal electrode.

As illustrated in FIG. 7, the first interlayer insulating film having the stacked structure of the TEOS oxide film 8 and the BPSG film 9 is formed to cover the gate electrode formed on the active region and the device isolating film 2, as in FIG. 1.

Thereafter, oxynitride layer (SION) 20 for fixing the first insulating film having the stacked structure of the TEOS oxide film 8 and the BPSG film 9 is deposited. The polysilicon electrode P2 is formed thereon. The succeeding procedure is the same as the procedure in FIG. 1.

Here, the silicon oxynitride film 20 both prevents impurities from the first interlayer insulating film from diffusing into the polysilicon electrode 10, and enhances adherence of the polysilicon electrode 10, thereby reducing the movement thereof.

As depicted in FIG. 8, the first interlayer insulating film having the stacked structure of the TEOS oxide film 8 and the BPSG film 9 is formed to cover the gate electrode formed on the active region and the device isolating film 2, as in FIG. 7. A first silicon oxynitride film 20 is deposited, and the polysilicon electrode 10 is formed thereon.

A second oxynitride film 30 is formed on the first silicon oxynitride film 20 to cover the polysilicon electrode 10. The subsequent processing is similar to the procedure illustrated in FIG. 1.

As did the silicon oxynitride film in FIG. 7, the first silicon oxynitride film 20 prevents impurities from being diffused into the polysilicon electrode 10, and enhances adherence of the polysilicon electrode 10.

Furthermore, the second silicon oxynitride film 30 decreases the movement of the polysilicon electrode 10 by enhancing adherence to the first silicon oxynitride film 20, and prevents impurities from the second interlayer insulating film 11 from diffusing into the polysilicon electrode 10 during subsequent thermal treatment processes.

As discussed earlier, the conventional method for fabricating the semiconductor device has the following disadvantages:

When the silicon oxynitride film is formed at the upper or lower portion of the polysilicon electrode, the movement of the polysilicon electrode cannot be completely prevented during the succeeding thermal treatment process.

Accordingly, the movement range of the polysilicon electrode is gradually increased during the thermal treatment process. In the case of the semiconductor device having a design rule below 0.2 μm, short is typically generated between the polysilicon electrode 10 and the metal electrode 12.

In addition, when the silicon oxynitride film is formed at the upper or lower portion of the polysilicon electrode and the thermal treatment process is performed at a temperature over 820° C., the polysilicon electrode is moved by the flow of the interlayer insulating film comprising the BPSG film. To prevent this movement, therefore, the thermal treatment process must be performed below 820° C.

A method for preventing a short between the polysilicon electrode and the metal electrode by forming a spacer in the contact hole has been suggested. This method relies on the spacer to insulate the metal electrode even if the polysilicon electrode is moved due to a subsequent thermal treatment process.

However, this method requires at least 10 additional steps to form the spacer in the contact hole, and further requires that a plug ion implantation process be selectively performed in the P+ regions and the N+ regions.

SUMMARY OF THE INVENTION

Accordingly, a primary object of the present invention is to provide a method for fabricating a semiconductor device which can prevent shorts from occurring between an interconnection line and a metal electrode.

Another object of the present invention is to provide a method for fabricating a semiconductor device which can improve electrical properties of the semiconductor device by eliminating leakage currents due to shorts between an interconnection line and a metal electrode.

Still another object of the present invention is to provide a method for fabricating a semiconductor device which can reduce fabrication costs and increase efficiency, by limiting or eliminating movement of an interconnection line only by adding only a one-step process.

Still another object of the present invention is to provide a method for fabricating a semiconductor device which can increase the yield of the semiconductor device and allow a uniform and stabilized fabrication process.

In order to achieve the above-described objects of the present invention, a method for fabricating a semiconductor device is provided that includes the steps of: forming a transistor on a semiconductor substrate; forming a first interlayer insulating film over the entire structure, including the transistor; planarizing the first interlayer insulating film; forming a stabilized insulating film consisting of an insulating material of low thermal expansion and shrinkage on the first interlayer insulating film; forming an interconnection line on the stabilized insulating film; forming a second interlayer insulating film on the stabilized insulating film in order to cover the interconnection line; and forming a metal electrode on the second interlayer insulating film in order to contact the semiconductor substrate.

A method for fabricating a semiconductor device is also provided that includes the steps of: forming a transistor on a semiconductor substrate; forming a first interlayer insulating film having a stacked structure of TEOS/BPSG films over the entire structure including the transistor; planarizing the first interlayer insulating film in accordance with flow and etching processes; forming a stabilized insulating film consisting of an insulating material of low thermal expansion and shrinkage on the first interlayer insulating film; forming an interconnection line on the stabilized insulating film; forming a second interlayer insulating film on the stabilized insulating film in order to cover the interconnection line; and forming a metal electrode on the second interlayer insulating film in order to contact the semiconductor substrate.

BRIEF DESCRIPTION OF THE DRAWINGS

The present invention will become better understood with reference to the accompanying drawings. These drawings are given only by way of illustration and are not to be considered as limiting the present invention, wherein.

DETAILED DESCRIPTION OF THE PREFERRED EMBODIMENTS

A method for fabricating a semiconductor device according to preferred embodiments of the present invention will now be described in detail with reference to the accompanying drawings.

FIGS. 9 to 15 are cross-sectional views illustrating the sequential steps of the method for fabricating the semiconductor device in accordance with a first embodiment of the present invention.

Figure 16:
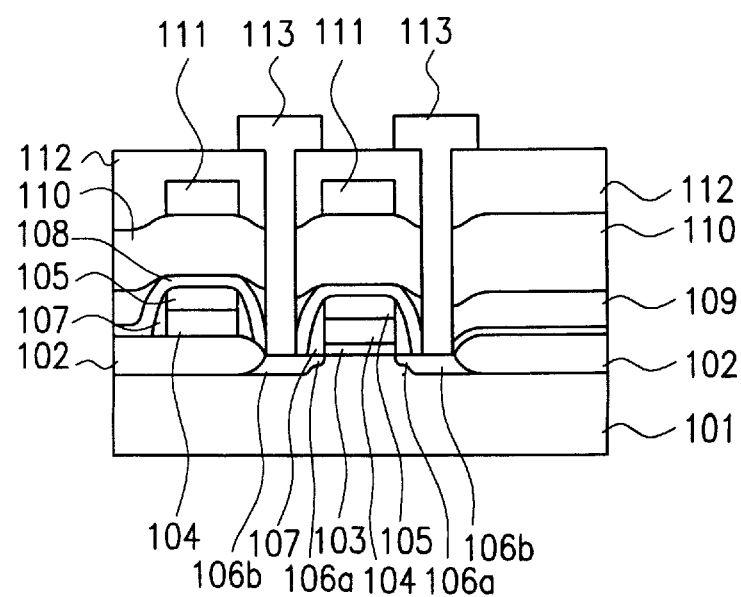
FIG. 16 is a cross-sectional view illustrating a method for fabricating a semiconductor device in accordance with a second embodiment of the present invention.

FIG. 16 is a cross-sectional view illustrating the method for fabricating the semiconductor device in accordance with a second embodiment of the present invention.

Figure 17:
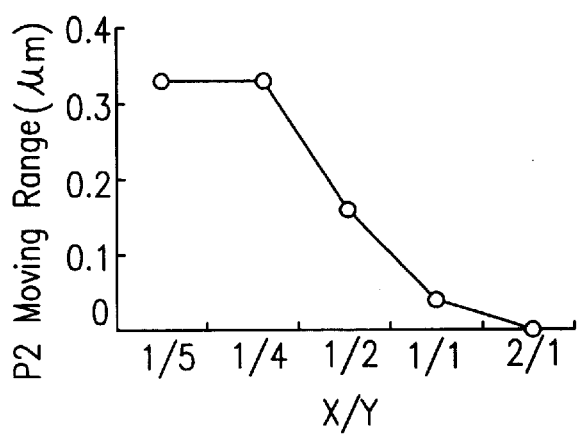
FIG. 17 is a graph showing a movement range of a polysilicon electrode according to a thickness ratio of a stabilized insulating film to a borophosphosilicate glass (BPSG) film.

FIG. 17 is a graph showing a movement range of a polysilicon electrode according to a thickness ratio of a stabilized insulating film and a borophosphosilicate glass (BPSG) film.

Figure 18:
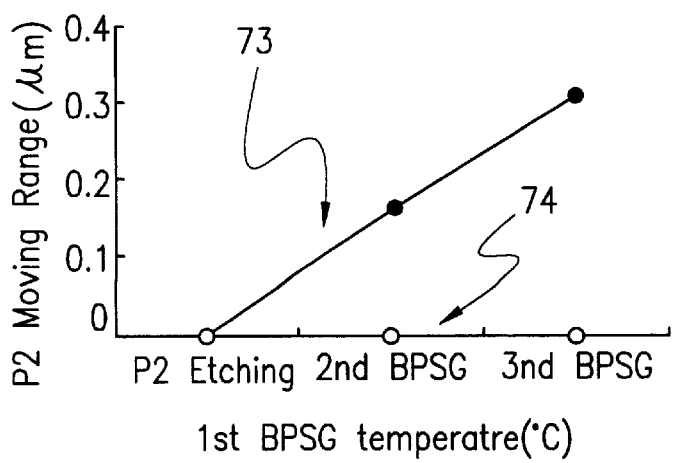
FIG. 18 is a graph comparing the results between the present invention and the conventional art with regard to the range of movement of the polysilicon electrode due to subsequent thermal treatment processes.

FIG. 18 is a graph showing a comparison result between the present invention and the conventional art in the movement range of the polysilicon electrode due to a thermal treatment process after the formation of an interconnection line.

Figure 9:
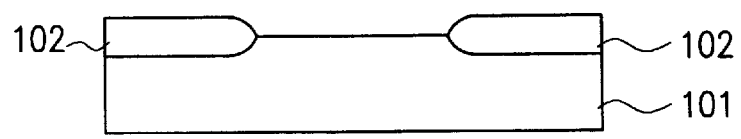
FIGS. 9 through 15 are cross-sectional views illustrating the sequential steps of a method for fabricating a semiconductor device in accordance with a first embodiment of the present invention.

As illustrated in FIG. 9, a device isolating film 102 is formed on a semiconductor substrate 101 to define an active region and a device isolating region.

Figure 10:
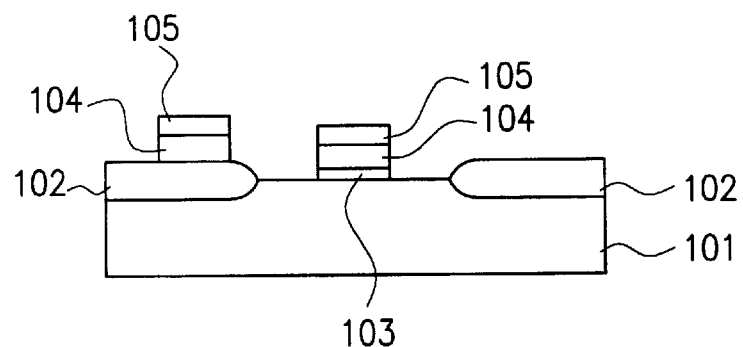

As depicted in FIG. 10, a gate oxide film 103, a gate conductive film 104 and a hard mask film 105 are sequentially stacked on the semiconductor substrate 101 of the active region, and patterned in a predetermined shape according to a photo lithography process.

Figure 11:
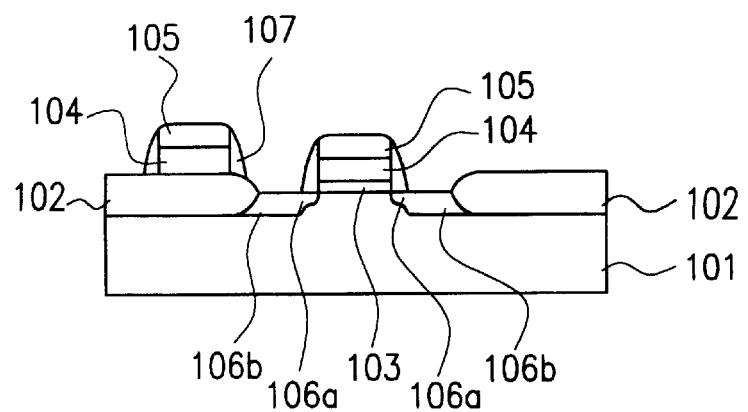

Referring to FIG. 11, spacers 107 are formed at the side portions of the gate oxide film 103, gate conductive film 104 and hard mask film 105, thereby forming a gate electrode.

Here, the semiconductor device of the active region forms a lightly-doped source/drain region 106a by lightly doping ions before forming the spacers 107, and forms a highly-doped source/drain region 106b by highly doping ions by using the spacers 107 as an ion implant interception film.

Figure 12:
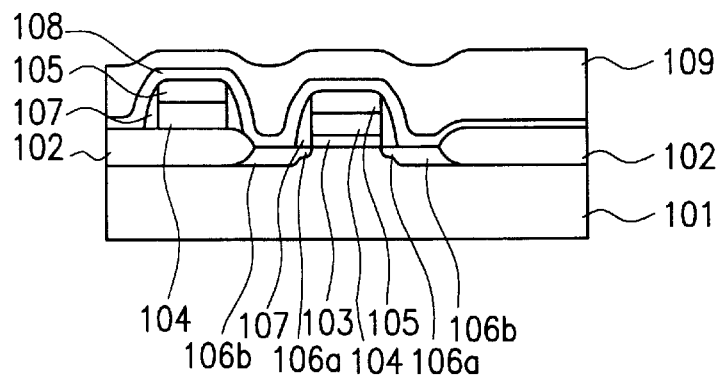

As shown in FIG. 12, a first interlayer insulating film having a stacked structure comprising a tetraethylorthosilicate (TEOS) oxide film 108 and a BPSG film 109 is formed to cover the semiconductor device, active region and device isolating region.

Thereafter, a process for flowing the BPSG film 109 at a high temperature and a succeeding etching process are performed so as to improve the device planarization.

Here, the high temperature flow process is carried out at a temperature ranging from 800 to 900° C. The etching process is a chemical mechanical polishing ("CMP") or a dry etching process using plasma. The BPSG film 109 is etched to remove a predetermined thickness.

Figure 13:
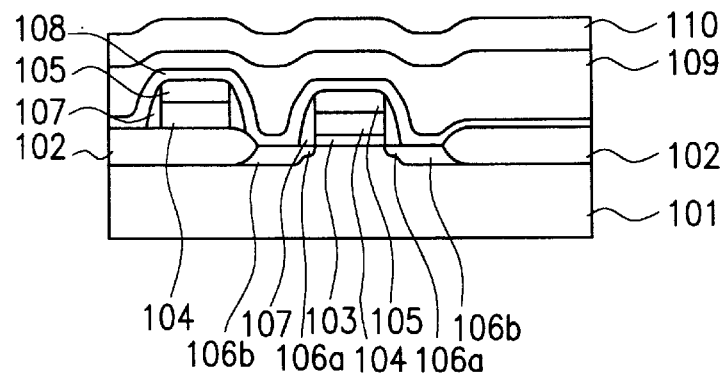

As illustrated in FIG. 13, a stabilized insulating film 110 is formed on the BPSG film 109 at a thickness below 3000 Å.

The stabilized insulating film 110 consists of an insulating material of low thermal expansion or shrinkage in the thermal treatment process. The insulating material is preferably LP-TEOS, PE-TEOS, HTO, USG, SiON or SiOF.

Figure 14:
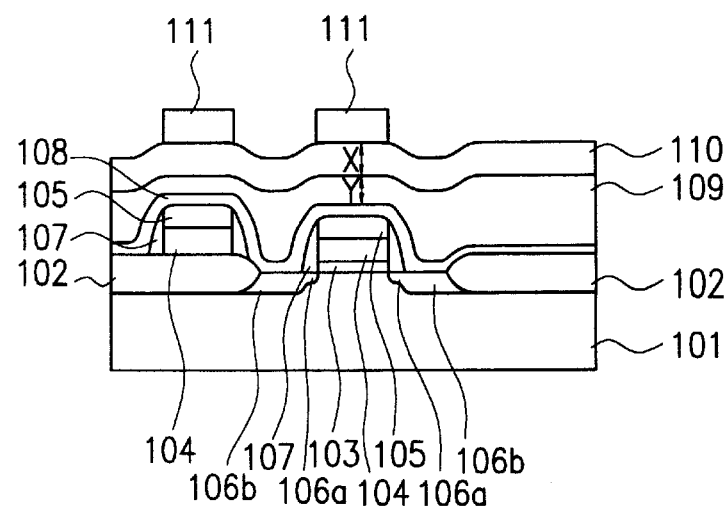

As shown in FIG. 14, a polysilicon electrode 111 is formed on the stabilized insulating film 110, and a succeeding thermal treatment process is carried out.

Here, the movement range of the polysilicon electrode 111 due to the thermal treatment process varies according to a ratio of a thickness X of the stabilized insulating film 110 to a thickness Y of the BPSG film 109 remaining on the gate electrode after the etching process.

FIG. 17 is a graph showing the movement range of the polysilicon electrode 111 during the succeeding thermal treatment process according to the thickness ratio of the thickness X of the stabilized insulating film to the thickness Y of the BPSG film.

Figure 1:
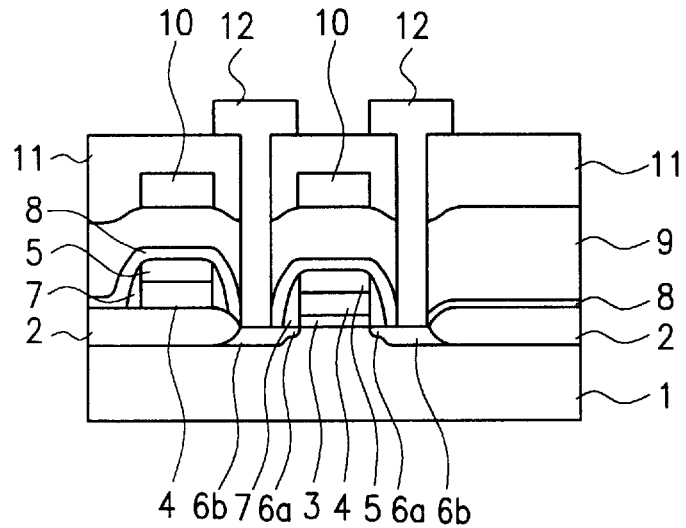
FIG. 1 is a cross-sectional view illustrating a conventional method for fabricating a semiconductor device.
Figure 2:
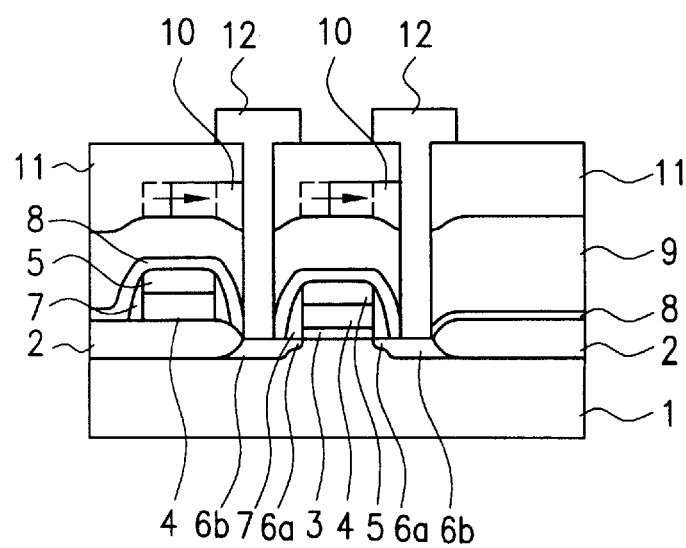
FIG. 2 is a cross-sectional view illustrating the conventional method for fabricating the semiconductor device in a state where shorts are generated between a polysilicon electrode and a metal electrode due to a thermal treatment process.
Figure 3:
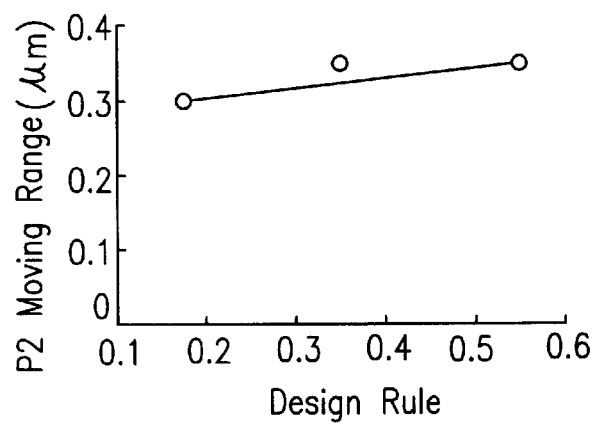
FIGS. 3 through 6 are graphs showing, respectively, a range of movement of the polysilicon electrode due to the thermal treatment process depending on variations in design rules, steps of the thermal treatment process, thermal treatment process temperatures, and the ratio of boron and phosphorus in the BPSG film.
Figure 4:
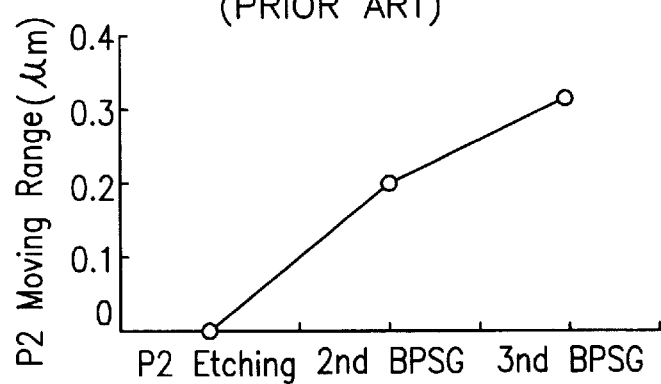
Figure 5:
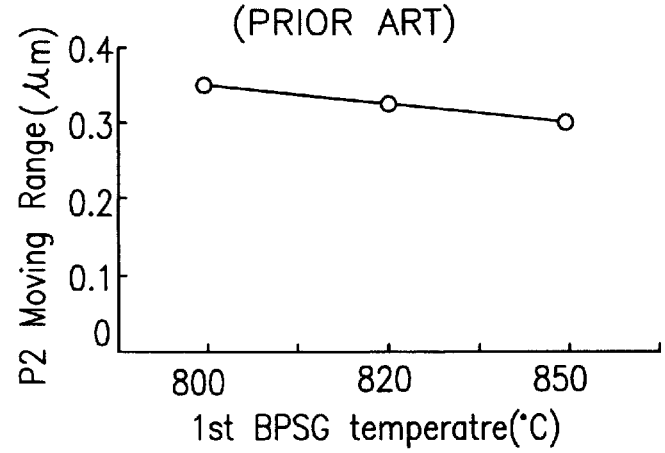
Figure 6:
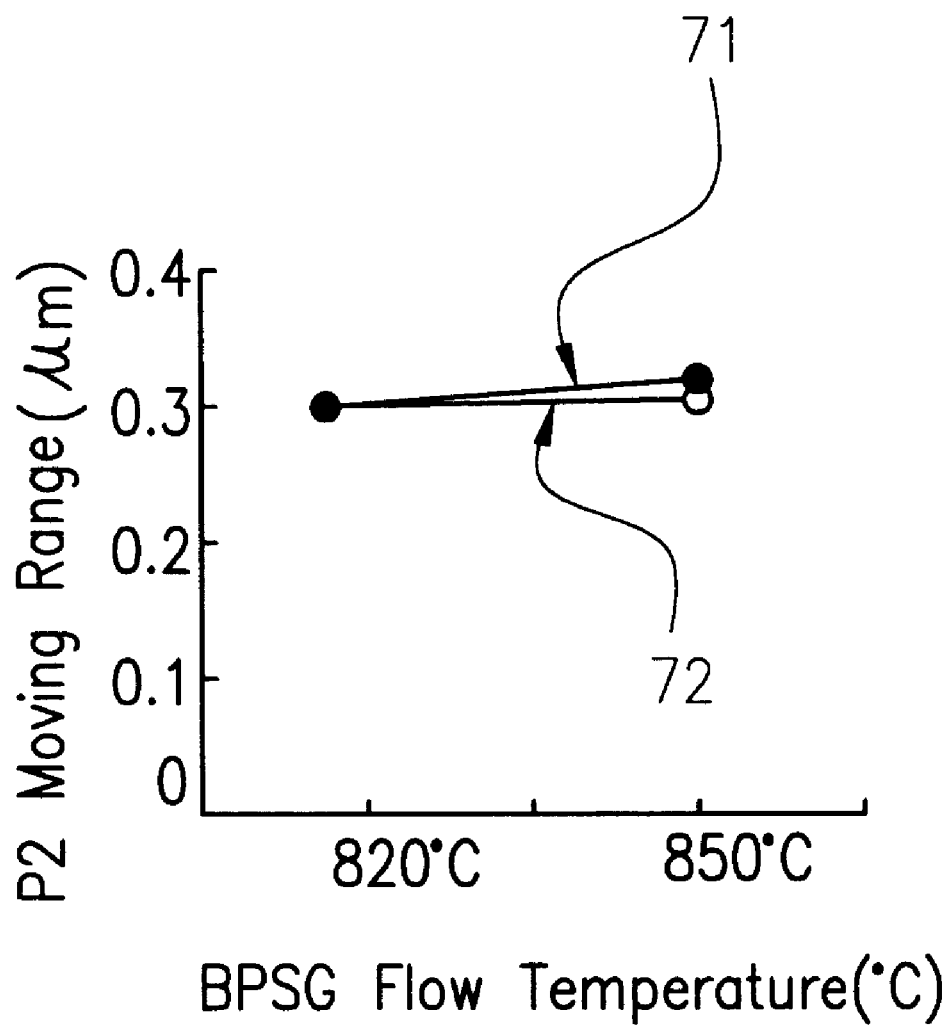
Figure 7:
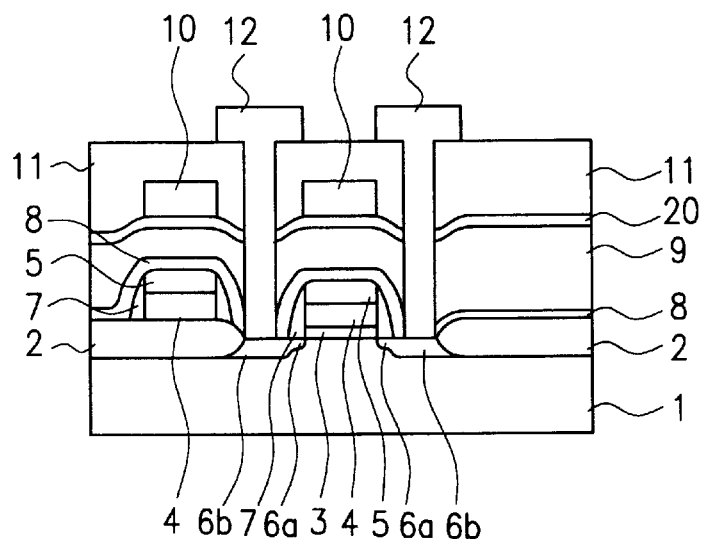
FIGS. 7 and 8 are cross-sectional views of a known technique for preventing shorts from being generated between the polysilcon electrode and the metal electrode.
Figure 8:
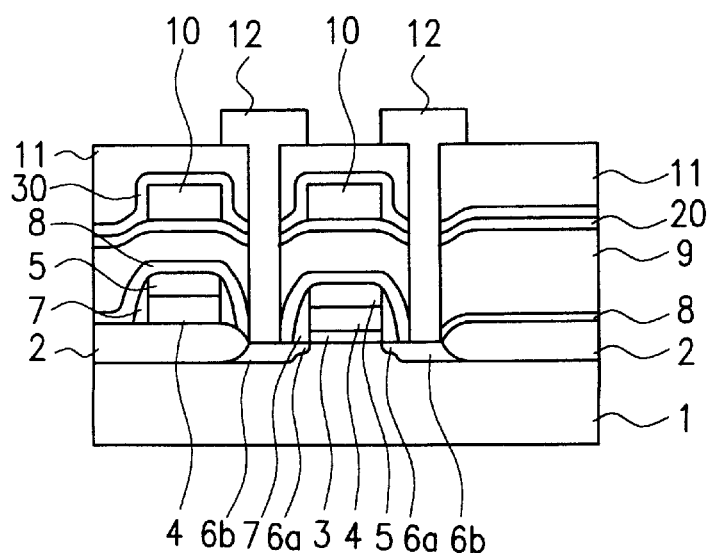

In FIG. 6, when the thickness ratio (X:Y) is below 1:4, the polysilicon electrode is moved by at least 0.3 µm as a result of the thermal treatment process. However, when the ratio is at least 1.5:1, the polysilicon electrode 111 is rarely moved.

Thus, when the etching process is performed to leave a predetermined portion of the BPSG film 109, the thickness ratio of the stabilized insulating film 110 to the BPSG film 109 is preferably adjusted to obtain a thickness ratio of at least 3:2.

Figure 15:
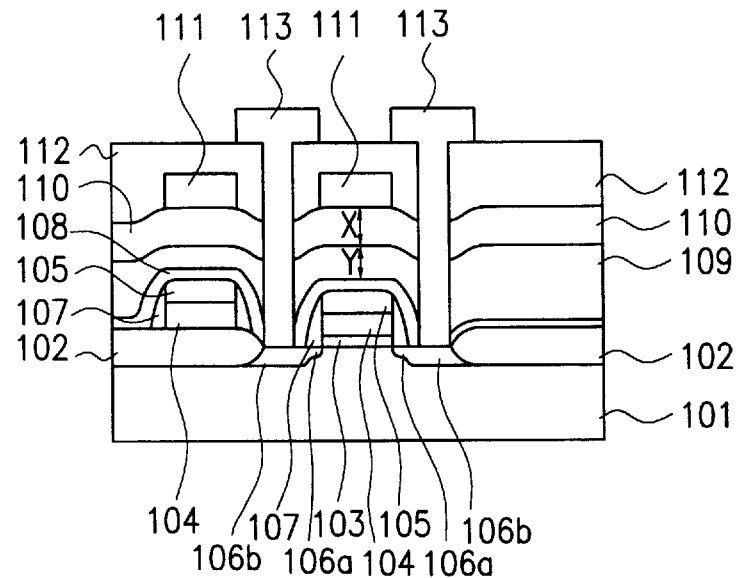

Referring to FIG. 15, a second interlayer insulating film 112 is formed over the entire structure to cover the polysilicon electrode 111. A metal electrode 113 is formed to contact the source/drain region.

On the other hand, in accordance with another embodiment of the present invention which is not illustrated, the planarization step of the first interlayer insulating film performs the high temperature flow process, etches the BPSG film 109 so that the TEOS oxide film 108 in the region where the polysilicon electrode 111 will be formed can be exposed, the stabilized insulating film 110 contacting the exposed TEOS oxide film 108.

As described above, when the polysilicon electrode 111 is formed on the contact portion of the TEOS oxide film 108 and the stabilized insulating film 110, the BPSG films formed on the opposite sides of the gate electrode being isolated from each other.

In addition, the BPSG film does not exist below the lower portion of the polysilicon electrode 111. Accordingly, the polysilicon electrode 111 is not moved due to the flow of the BPSG film during subsequent high temperature thermal treatment process.

In accordance with a second embodiment of the present invention as shown in FIG. 16, the procedures as shown in FIGS. 9 to 12 are performed until the TEOS oxide film 108 is formed. Thereafter, the BPSG film 109 is formed on the entire structure so that a predetermined portion of the TEOS oxide film 108 can be exposed, and the stabilized insulating film 110, polysilicon electrode 111, second interlayer insulating film 112 and metal electrode 113 being sequentially formed.

As discussed earlier, in the semiconductor device fabricated in accordance with the present invention, the stabilized insulating film 110 interrupts the flow of the BPSG film 109 of the interlayer insulating film, thereby preventing the polysilicon electrode 111 from being moved during the subsequent thermal treatment processes.

As a result, although the multi-step thermal treatment process is performed, shorts are not generated between the polysilicon electrode 111 and the metal electrode 113.

When the semiconductor device is observed through a scanning electron microscope subsequent to the multi-step thermal treatment process, there is rarely any indication that the polysilicon electrode has moved.

In addition, the polysilicon electrode remains separated from the metal electrode at a predetermined interval, thus preventing shorts from being generated therebetween.

FIG. 18 is a graph showing a comparison result between a movement range 73 of the polysilicon electrode in the conventional art and a movement range of the polysilicon electrode in the present invention 74 during second and third high temperature thermal treatment process.

As illustrated in FIG. 18, when the polysilicon electrode is formed on the BPSG film in the conventional method, the polysilicon electrode is moved by at least 0.3 µm during the second and third high temperature thermal treatment process.

Conversely, in the stacked structure of the present invention wherein the thickness ratio of the stabilized insulating film to the BPSG film is at least 3:2 the polysilicon electrode rarely moves.

Here, the interconnection line is formed by using the polysilicon electrode. However, the interconnection line may be selected from the group consisting of $WSi_x$, $PtSi_x$, $CoSi_x$, $TiSi_x$, and $WSi_x$/polysilicon.

Figure 19:
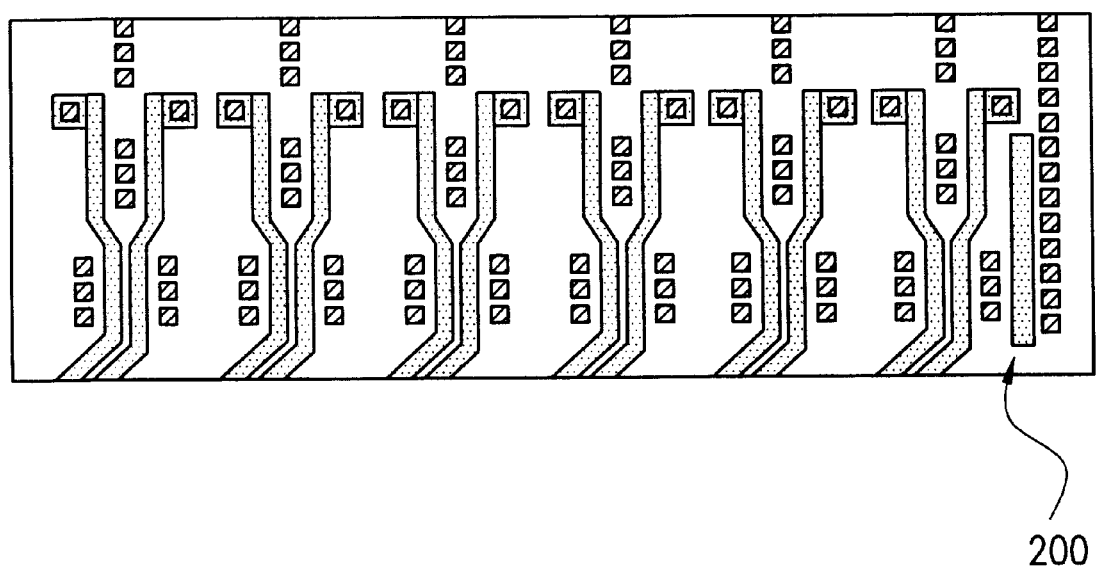

As another method for preventing short between the polysilicon electrode and the metal electrode, when a layout is performed on a wafer, dummy contacts or dummy bar patterns as shown in FIG. 19 may be formed at predetermined intervals from the polysilicon electrode.

As discussed earlier, the method for fabricating the semiconductor device in accordance with the present invention has the following advantages:

The interconnection line on the interlayer insulating film is not moved as a result of the thermal treatment process, and thus does not cause shorts to form with the metal electrode.

Leakage currents are also not generated due to shorts between the interconnection line and the metal electrode, thereby improving electrical properties of the semiconductor device.

In addition, the movement of the interconnection line is prevented by adding just one process step, not a plurality of processes, and thus fabrication costs are reduced and efficiency of the device is increased.

By reducing both the number of shorts and the number of process steps, the present method increases the yield of the semiconductor devices and improves the stability and predictability of the fabrication process.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims. Therefore, all changes and modifications that fall within the meets and bounds of the claims, or equivalences of such meets and bounds are therefore intended to be embraced by the appended claims.

What is claimed is:

1. A method for fabricating a semiconductor device comprising the steps of:

forming a transistor on a semiconductor substrate;

forming a first interlayer insulating film over the entire structure including the transistor;

planarizing the first interlayer insulating film;

forming a stabilized insulating film consisting of an insulating material of low thermal expansion and shrinkage on the first interlayer insulating film;

forming an interconnection line on the stabilized insulating film;

forming a second interlayer insulating film on the stabilized insulating film to cover the interconnection line; and forming a metal electrode on the second interlayer insulating film to contact the semiconductor substrate.

2. The method according to claim 1, wherein the first interlayer insulating film has a stacked structure of TEOS/BPSG films.

3. The method according to claim 1, wherein the step for planarizing the first interlayer insulating film comprises the sub-steps of:

flowing the first interlayer insulating film at a high temperature; and etching the first interlayer insulating film.

4. The method according to claim 3, wherein the high temperature flow process is performed at a temperature from about 700 to about 900° C.

5. The method according to claim 3, wherein the etching step comprises chemical mechanical polishing or a plasma dry etch.

6. The method according to claim 2, wherein the BPSG film is etched so that a predetermined thickness of the BPSG film remains, or that the TEOS film is exposed.

7. The method according to claim 1, wherein the stabilized insulating film is selected from the group consisting of LP-TEOS, PE-TEOS, PE-Oxide, HTO, USG, SiON and SiOF.

8. The method according to claim 7, wherein the stabilized insulating film has a thickness of less than 3000 Å.

9. The method according to claim 1, wherein the interconnection line is selected from the group consisting of polysilicon electrode, $WSi_x$, $PtSi_x$, $CoSi_x$, $TiSi_x$ and $WSi_x$/polysilicon.

10. The method according to claim 6, wherein, when the BPSG film is etched so that a predetermined thickness of the BPSG film remains, a thickness ratio of the stabilized insulating film to the BPSG film is at least 1.5:1 below the interconnection line.

11. The method according to claim 6, wherein, when the first interlayer insulating film is etched so that portions of the TEOS film are exposed, the stabilized insulating film being formed on and in contact with the exposed TEOS film, and the interconnection line being formed on the stabilized insulating film.

12. A method for fabricating a semiconductor device comprising the steps of:

forming a transistor on a semiconductor substrate;

forming a first interlayer insulating film having a stacked structure of TEOS/BPSG films over the entire structure including the transistor;

planarizing the first interlayer insulating film utilizing flow and etching processes;

forming a stabilized insulating film consisting of an insulating material of low thermal expansion and shrinkage on the first interlayer insulating film;

forming an interconnection line on the stabilized insulating film;

forming a second interlayer insulating film on the stabilized insulating film to cover the interconnection line; and forming a metal electrode on the second interlayer insulating film to contact the semiconductor substrate.

13. The method according to claim 12, wherein the step for planarizing the first interlayer insulating film comprises the sub-steps of:

flowing the first interlayer insulating film at a high temperature; and etching the first interlayer insulating film utilizing a chemical mechanical polishing process or a dry etching process.

14. The method according to claim 13, wherein the high temperature flow process is performed at a temperature from about 700 to about 900° C.

15. The method according to claim 12, wherein the BPSG film is etched so that a predetermined thickness of the BPSG film remains in a predetermined area, or that portions of the TEOS film are exposed.

16. The method according to claim 12, wherein the stabilized insulating film is selected from the group consisting of LP-TEOS, PE-TEOS, PE-Oxide, HTO, USG, SiON and SiOF.

17. The method according to claim 12, wherein the stabilized insulating film has a thickness of less than 3000 Å.

18. The method according to claim 12, wherein the interconnection line is selected from the group consisting of polysilicon electrode, $WSi_x$, $PtSi_x$, $CoSi_x$, $TiSi_x$ and $WSi_x$/polysilicon.

19. The method according to claim 15, wherein, when the BPSG film is etched so that a predetermined thickness of the BPSG film remains, a thickness ratio of the stabilized insulating film to the BPSG film is at least 1.5:1 in the area over which the interconnection line is to be formed.

20. The method according to claim 15, wherein, when the first interlayer insulating film is etched to expose the TEOS film, the stabilized insulating film is contacts the exposed TEOS film, and the interconnection line is formed thereon.

* * * * *